(12) United States Patent
Parkhurst

(10) Patent No.: US 9,898,208 B2
(45) Date of Patent: Feb. 20, 2018

(54) STORAGE SYSTEM WITH HYBRID LOGICAL VOLUMES UTILIZING IN-BAND HINTING

(71) Applicant: DataDirect Networks, Inc., Chatsworth, CA (US)

(72) Inventor: Michael Parkhurst, Newbury Park, CA (US)

(73) Assignee: DataDirect Networks, Inc., Chatsworth, CA (US)

( * ) Notice: Subject to any disclaimer, the term of this patent is extended or adjusted under 35 U.S.C. 154(b) by 30 days.

(21) Appl. No.: 15/140,305

(22) Filed: Apr. 27, 2016

(65) Prior Publication Data

US 2017/0315733 A1 Nov. 2, 2017

(51) Int. Cl.
*G06F 3/06* (2006.01)
*G11C 16/10* (2006.01)

(52) U.S. Cl.
CPC .......... *G06F 3/0611* (2013.01); *G06F 3/0659* (2013.01); *G06F 3/0685* (2013.01); *G06F 3/0688* (2013.01); *G06F 3/0689* (2013.01); *G11C 16/10* (2013.01); *G06F 2212/217* (2013.01)

(58) Field of Classification Search
None
See application file for complete search history.

(56) References Cited

U.S. PATENT DOCUMENTS

| | | | | |
|---|---|---|---|---|
| 7,127,633 B1* | 10/2006 | Olson | ................. | G06F 11/2092 714/4.4 |
| 7,873,619 B1* | 1/2011 | Faibish | ............. | G06F 17/30091 707/705 |
| 8,407,437 B1* | 3/2013 | Cheng | ................... | G06F 11/108 711/103 |
| 2002/0144028 A1* | 10/2002 | Schatzberg | ........... | G06F 3/0613 710/36 |
| 2003/0217310 A1* | 11/2003 | Ebsen | ................. | G06F 11/1438 714/42 |
| 2006/0129749 A1* | 6/2006 | Nakanishi | ............. | G06F 3/0613 711/103 |
| 2007/0288692 A1* | 12/2007 | Bruce | ..................... | G06F 3/061 711/113 |

(Continued)

*Primary Examiner* — Kaushikkumar Patel
(74) *Attorney, Agent, or Firm* — SoCal IP Law Group LLP; Mark A. Goldstein

(57) ABSTRACT

Systems and methods that combine a silicon storage volume with a hard disk drive (HDD) volume in a storage system that uses in band hinting to select the volume for storing actual data and meta data based on the demands of high performance computing are described. A storage system with an application processor, a storage processor, a silicon storage volume including a plurality of SSDs and an HDD with a much larger number of HDDs efficiently handles write requests from a high performance computer. A high performance computing device prepares internal meta data and actual data write requests by specifying in the internal write requests whether the data is actual data or meta data using an existing field. The storage processor receives the internal write requests and manages storage of the meta data in the silicon storage volume and actual data in the HDD volume.

12 Claims, 2 Drawing Sheets

(56) References Cited

U.S. PATENT DOCUMENTS

| | | | |
|---|---|---|---|
| 2009/0168525 A1* | 7/2009 | Olbrich | G06F 13/1657 365/185.11 |
| 2009/0327626 A1* | 12/2009 | Kaushik | G06F 11/1466 711/162 |
| 2010/0070699 A1* | 3/2010 | Lee | G06F 3/0613 711/112 |
| 2013/0013561 A1* | 1/2013 | Chan | G06F 17/30132 707/636 |
| 2013/0179733 A1* | 7/2013 | Frank | G06F 11/261 714/29 |
| 2014/0250155 A1* | 9/2014 | Chen | G06F 17/30091 707/823 |
| 2015/0142976 A1* | 5/2015 | Farasat | H04L 47/70 709/226 |
| 2016/0179711 A1* | 6/2016 | Oikarinen | G06F 3/061 710/40 |
| 2017/0097775 A1* | 4/2017 | Ben Dayan | G06F 3/0605 |
| 2017/0242625 A1* | 8/2017 | Pandurangan | G06F 3/0659 |

* cited by examiner

STORAGE SYSTEM WITH HYBRID LOGICAL VOLUMES UTILIZING IN-BAND HINTING

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This disclosure relates to storing data in a data storage system and a method for increasing the performance of storing data in a data storage system by directing certain data to silicon storage devices and other data to hard disk drives.

Description of the Related Art

A file system is used to store and organize computer data stored as electronic files. File systems allow files to be found, read, deleted, and otherwise accessed. File systems store files on one or more storage devices. Storage devices come in basically three variations, rotating media (for example hard disk drive), solid state medium (silicon storage devices or SSDs), and a hybrid rotating media device combined with a solid state media device. Rotating media storage devices (hard disk drives) have the advantage of being quite large with a relatively low cost. For sequential reading or writing hard disk drives they perform well. Being that they rotate as well as change tracks into order to move the read/write head, hard disk drives have limits as to how fast they access data from one side of the media to the other. These limitations are known as seek time and rotational delay. As such hard disk drives have a maximum transfer rate limited by these physical properties.

Solid state media such as SSDs have the advantage of no moving parts. This results in access times for data that are consistent for all locations on the media in the SSD. Unfortunately SSDs are more expensive per gigabyte than hard disk drives and have historically come in smaller capacities than hard disk drives. Additionally SSDs have a longer erase cycle than hard disk drives. Therefore overwriting previous data on SSDs is typically slower than on hard disk drives. An advantage of SSDs is that reading or writing data from random locations can be many times faster than with a hard disk drive.

Hybrid drives and storage systems are a combination of flash memory, the technology SSDs are based on, and rotating media or HDDs. The flash memory on a hybrid drive is used to expand the available drive cache and also to act as a burst buffer for incoming writes. For a write, once the data is committed to flash memory an acknowledgement is returned to the command originator. Later, when it is opportune, the hybrid drive then transfers the data to the rotating media thus freeing up the flash memory for more incoming data. In this way hybrid drives minimize head movement of the rotating media (hard drive) portion of the hybrid drive and aggregate writes to improve performance.

In high performance computing environments, the Lustre Parallel File System is often used to accommodate rapid and high volume writing and reading of data, particularly the reading and writing of very large amounts of data in a sequential manner. The Lustre file system stripes data across multiple storage devices (hard disk drives) so as to increase performance. To achieve this, each storage device contains meta data about the usage of the storage device as well as the actual data on the device. This meta data is commonly distributed as well as duplicated at predetermined locations on the storage device. Thus, as data is being written to the storage devices, meta data is also being updated on the storage devices. However, this writing data and meta data updating results in the storage device accessing many different locations on the storage device in rapid secession causing the file system on each of the storage devices to thrash their read-write heads. This thrashing is caused by first writing the data to the drive and then moving the head to a superblock on the drive for updating. There are multiple superblocks on the Ext4 formatted hard disks and they contain information about the location of data on the disk. Additionally the superblocks are duplicated on the storage devices to insure readability if a section of the disk is corrupted. Thus, for every write of data, the superblock(s) on the storage devices are updated. Because the superblocks are distributed across the storage device, the read-write head thrashes from one side of the disk to the other during a continual data write that is common in high performance computing.

DETAILED DESCRIPTION

The systems and methods described herein combine a solid state drive (also known as a silicon storage device) (SSD) volume with hard disk drive (HDD) volumes in a storage system that uses in band hinting to choose which device to use based on the demands and circumstances. By combining these two different storage technologies in a storage system, the shortcomings of these two kinds of storage devices are overcome. For a parallel file system to achieve high performance, the storage system typically reads and writes data to a series of storage devices in a manner known as striping. In addition to the actual data the underlying file system also writes meta data. By using the group number field of the Small Computer System Interface (SCSI) command descriptor block (CDB) to identify the type of read or write, the storage system uses both the SSD volume and the HDD volumes to satisfy the request.

The system described herein uses an in-band hinting technique to direct normal data reads and writes to one or more spinning media (hard disk drive) volumes and to direct meta data reads and writes to an SSD volume. By implementing in-band hinting, as the storage system accesses the storage media in a sequential manner, the hard disk volumes do not need to move their read-write heads to access meta data. The resulting minimization of head movement of the hard disk drives causes the storage system to achieve faster reads and writes, increasing throughput and efficiency of the data storage system.

Data processed by the storage system includes the actual data and data about the actual data known as meta data. Because the meta data is much smaller in size than the actual data, the total size of the SSD volume will be much smaller than the total size of the hard disk drive volume or volumes. In practice, meta data for multiple HDDs or virtual disks may be stored on one SSD. Both the SSD and HDD volumes may be Redundant Array of Independent Disks (RAID) based and use the same discrete I/O size so as to simplify the redirection process. A non-volatile table is maintained to translate the meta data logical block address (LBA) from the original LBA that refers to a location on the hard disk drive to one that is used on the SSD volume, and then to re-translate it back later.

Environment

Figure 1:
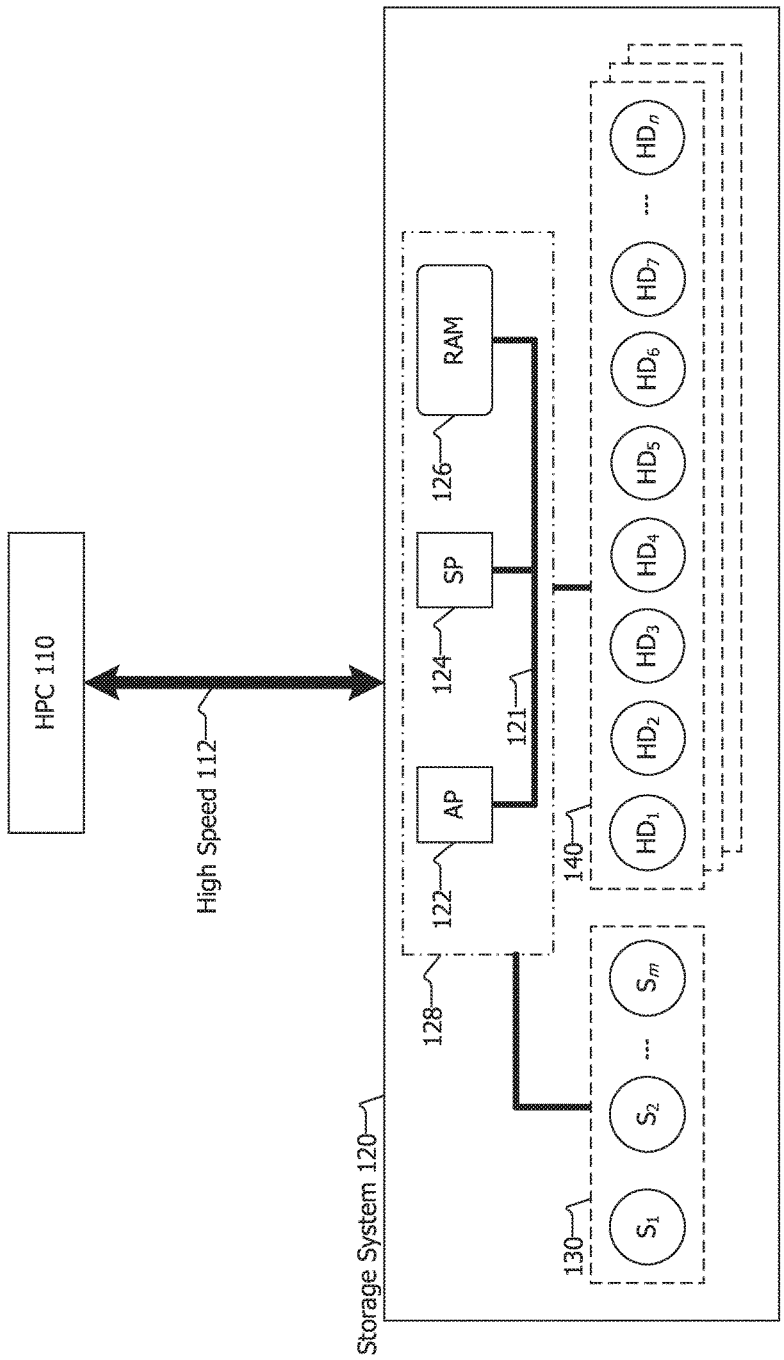
FIG. 1 is a block diagram of a data storage system.
Figure 2:
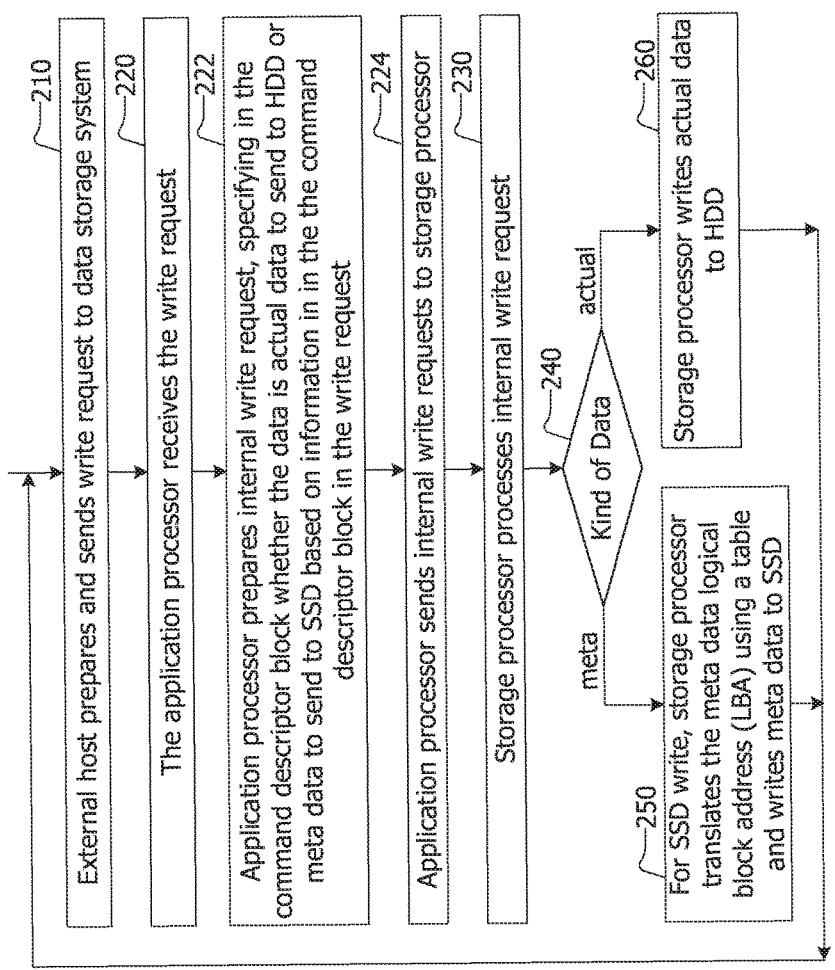
FIG. 2 is a flow chart of the actions taken to process data with in-band hinting in a data storage system.

FIG. 1 is a block diagram of a data storage system 120. The data storage system 120 is coupled with a high performance computer or computing system (HPC) 110 via a high speed connection 112. The high performance computer may be a super computer or group of computing devices arranged as a computing system or compute cluster. The high performance computer creates large amounts of data very quickly, and that data needs to be stored quickly. To do this, the data is stored in parallel. In an EXT4 filesystem, information about where the data is stored and how it is broken up into smaller portions or stripes is stored with the actual data as meta data, or data about the data. For instance the Lustre parallel file system is implemented on top of an EXT4 filesystem. Even though Lustre maintains separate volumes for meta data, both the actual Lustre data and its meta data reside on top of the EXT4 filesystem which has its own meta data.

The high speed connection 112 may conform to one of INFINIB AND, OMNIPATH, CASCADE, or GEMINI architecture or standard and their progeny, may be an optical fiber technology, may be proprietary, and the like.

The data storage system 120 includes two virtual storage volumes or groups, one being silicon-based 130 and the other being spinning media, hard disk drives 140. The silicon storage 130 may be one or more of solid state drives (SSDs), flash memory, NAND-based flash memory, phase change memory, spin torque memory, carbon nanotube memory, memristor memory and other non-volatile storage that is not spinning media such as hard disk drives. The data storage system 120 typically includes a relatively small number of solid state drives in the silicon volume or group while the number of hard disk drives in the other volumes or groups is a much greater number. The meta data for the hard disk volumes or groups 140 may be spread among and stored dynamically among the SSD volume or group 130.

The term data unit as used herein includes a bit, byte, word, block, stripe or other unit of information. In one embodiment, data is stored within and by the data storage system as stripes. A data item may be stored as one or multiple data units. That is, a data unit may be a data item or a portion of a data item. As used herein, the term data item is inclusive of entire computer readable files or portions of a computer readable file as provided by a client, the high performance computer. The computer readable file may include or represent text, numbers, data, images, photographs, graphics, audio, video, raw data, scientific data, computer programs, computer source code, computer object code, executable computer code, and/or a combination of these and similar information.

Many data intensive applications quickly produce and need to store a large quantity of data, these applications include scientific applications, scientific lab data, and others.

The data storage system 120 may, in various configurations be coupled with one or more server computers, a local area network, a wide area network such as the Internet, and/or a private wide area network. The data storage system 120 may be connected with other data storage systems via a local area network by wire lines, optical fiber cables, wireless communication connections, and others, and may be a combination of these. The local area network and/or wide area network may include enhanced security features. The local area network and/or wide area network may include one or more networking devices such as routers, hubs, firewalls, gateways, switches and the like.

The data storage system 120 includes at least one computer processor and is shown configured with two, an application processor (AP) 122 and a storage processor (SP) 124. The processors may be general purpose central processing units. The storage processor 124 may be a specialized processor that is configured or designed to handle data storage requests and manage data storage efficiently, such as, for example Small Computer System Interface (SCSI), Serial Attached SCSI (SAS) and a Redundant Array of Independent Disks (RAID) processor. In other configurations a single multi-core processor may be used and some cores in the single processor may be dedicated to application processor tasks and others to storage processor tasks. In one embodiment, the hard disk drives "HD" in the hard disk volumes or groups 140 and the SSDs "S" in the SSD volume or group 130 may be coupled with each other using SAS. As shown, in the example configuration of FIG. 1, the application processor 122 and storage processor 124 are coupled with a bus 121 to a volatile memory such as random access memory (RAM) 126 which in some embodiments may be included on or configured as a controller on a single circuit board 128. The application processor 122 and storage processor 124 may be implemented as and/or included as one or more of an FPGA, ASIC, PLD and PLA included as a controller. The controller may include or be coupled with a high speed network interface that allows the storage system to communicate over high speed interface 112 with HPC 110.

The data storage system 120 operates according to a proprietary operating system. The application processor 122 may execute the proprietary operating system, and the operating system may be a variant of a UNIX or LINUX kernel. The operating system may be configured so that all processes operate in user space for increased processing efficiency gained from less task management and reduced task switching.

In other configurations, the storage device may additionally or alternatively include one or more of logic arrays, memories, analog circuits, digital circuits, software, firmware, and processors such as microprocessors, field programmable gate arrays (FPGAs), application specific integrated circuits (ASICs), programmable logic device (PLDs) and programmable logic array (PLAs). The software, hardware and firmware components of the storage system 120 include various specialized units, circuits, software and/or interfaces for providing the functionality and features described herein. The processes, functionality and features described herein may be embodied in whole or in part in software which operates on the one or more processors in the storage system, and in particular in the application processor 122. The processes, functionality and features described herein may be embodied in whole or in part in software which operates on one or more processors, and which may be in the form of one or more of firmware, an application program, object code, machine code, an executable file, an applet, a COM object, a dynamic linked library (DLL), a dynamically loaded library (.so), a script, one or more subroutines, or an operating system component or service, and other forms of software.

The terms "storage media" and "storage device" are used herein to refer nonvolatile media and storage devices. Nonvolatile media and storage devices are media and devices that allow for retrieval of stored information after being powered down and then powered up. That is, nonvolatile media and storage devices do not lose stored information when powered down but maintain stored information when powered down. Storage media and devices refer to any configuration of hard disk drives (HDDs), solid-states drives (SSDs), silicon storage devices, flash memory devices, magnetic tape, optical discs, nonvolatile RAM, carbon nanotube memory, ReRam memristors, and other similar nonvolatile storage media and devices. Storage devices and media include magnetic media and devices such as hard disks, hard disk drives, tape and tape players, flash memory and flash memory devices; silicon-based media; nonvolatile RAM including memristors, resistive random-access memory (ReRam), and nano-RAM (carbon nanotubes) and other kinds of NV-RAM. Storage devices and storage media allow for reading data from and/or writing data to the storage device/storage medium. Hard disk drives, solid-states drives and/or other storage media may be arranged in the silicon volume 130 and the HDD volume 140 according to any of a variety of techniques including RAID.

The storage media included in the silicon storage volume 130 and the HDD storage volume 140 may be of the same capacity, may have the same physical size, and may conform to the same specification, such as, for example, a hard disk drive specification. Example sizes of storage media include, but are not limited to, 2.5" and 3.5". Example hard disk drive capacities include, but are not limited to, 1, 2 3 and 4 terabytes. Example hard disk drive specifications include Serial Attached Small Computer System Interface (SAS), Serial Advanced Technology Attachment (SATA), their progeny, and others. Example SSD capacities include, but are not limited to, 500 gigabytes, 1, 2 and 3 terabytes. Example SSD specifications include SAS, SATA, Non-Volatile Memory Express (known as NVM Express and NVMe), their progeny, and others. An example HDD volume 140 in the storage system 120 may include 64 or 86 hard disk drives (such that n=64 or 86) conforming to the SATA standard whereas the silicon storage volume 130 may have 2 or 3 SSDs (such that m=2 or 3). In other configurations, the HDD storage volume 140 may include more and fewer drives, such as, for example, 32, 84, 96, and others. As shown in FIG. 1, the SSD volume 130 may have m silicon drives whereas the HDD volume 140 may have n hard disk drives, where n is much greater than m.

The storage volumes 130 and 140 in a storage system 120 may be included in a single cabinet, rack, shelf or blade. When the storage media in a storage node are included in a single cabinet, rack, shelf or blade, they may be coupled as RAID sets of SAS devices. One or more controllers (not shown) may be included in the cabinet, rack, shelf or blade with the storage devices.

The storage volumes 130 and 140 may be included in two or more racks, shelfs, cabinets and/or other storage units that may be that may include a communications interface and/or backplane that allows for connection among the storage devices in the storage volume. In one embodiment there is no backplane and the storage devices and storage volumes are coupled via a communications interface. The communications interface may allow for the transmission of and receipt of information according to one or more of a variety of wired standards, including, for example, but not limited to SAS, SATA, SATA Express, PCI Express (also known as PCIe), and their progeny.

Referring again to FIG. 1, the client of the storage system is a high performance computer or computing system 110. To facilitate the storage of data according to the methods described herein, the high performance computer sends a storage request to store a data unit to the storage system and the application processor in conjunction with the storage processor handle the request. Specifically, the application processor processes the request and instead of writing both meta data and actual data to a single volume of HDDs, the application processor designates that meta data for actual data is to be written to the silicon storage volume while the actual data is written to the HDD volume. This is achieved by the application processor recognizing a code or designator in a field in data storage requests received from the HPC 110. This is described in more detail in the next section.

Processes

The methods described herein provide how a storage system that combines a silicon storage volume with a hard disk drive volume using in band hinting to increase storage performance in a high performance computing environment. As a preliminary step, a high performance computer or other external host computing device prepares a write request specifying or including a data unit and sends the write request to the storage system, as shown in block 210. The write request includes a designation of which of which HDD storage volume to use. The external host uses existing portions or fields of the file system formatted write requests and repurposes them. The application processor in the storage system receives the write request, as shown in block 220.

Depending on the implementation, the application processor in the storage system processes the original write request and prepares internal write requests specifying in the command descriptor block (CDB) whether the data is actual data which will be sent to an HDD volume or meta data which will be sent to an SSD in the silicon storage volume, as shown in block 222. The application processor in doing this uses the same kind of data designation and same payload in the internal write request that was received from the external host in the original write request. The designation of whether the data is actual data or meta data may be included in the group number field in a SCSI CDB entry that originated with the external host. This specification of the kind of data will conform in size and kind to the particular field being used in the CDB or other specified field. That is, a specified, well-known but unused field from a storage protocol is used and repurposed to include a designation of whether the data in the write request if for actual data or meta data. For example, depending on the field being used, the kind of data designation may be may be a word (or any of a variety of sizes), byte or other memory size with a numerical designation, alphabetic designation or alpha-numeric designation of the kind of data. It is the external host that includes the kind of data designation in the original write request, and the storage system repurposes the kind of data designation to more efficiently process and manage the data between SSD and HDD storage included in the hybrid data storage system.

The application processor sends the internal write requests to the storage processor, as shown in block 224. The storage processor in the storage system processes the internal write requests received from the application processor, as shown in block 230. The storage processor then proceeds based on a check of the kind of data, that is, whether the data is actual data or meta data, as shown in block 240. When the storage processor identifies the data as meta data, the storage processor translates the meta data logical block address (LBA) included in the internal storage request using a table stored on the silicon storage volume and writes meta data to an SSD in the silicon storage volume, as shown in block 250. When the data is actual data, the storage processor writes actual data to an HSS in the HDD volume, as shown in block 260. The flow of actions then returns to block 210 and additional storage requests are received and processed.

Depending on the particular implementation, meta data may remain stored on the silicon storage volume until the associated actual data is deleted from the HDD. However, the meta data stored on the silicon storage volume may need to be removed to conform to changes made to data stored on the HDD volume. This may occur when data is moved on the HDD when the storage system resizes or reconfigures allocation of the HDD or when the HPC resizes partitions on virtual disks stored on an HDD volume. Depending on the implementation, when the system or HPC changes priorities or otherwise reconfigures the HDD, the meta data on the silicon storage volume is modified to conform to the HDD changes. To implement this, the storage system moves meta data from an SSD in the silicon storage volume to an HDD in the HDD volume, including re-translating the meta data logical block address (LBA) using the table, as shown in block 270; the system then creates new LBAs reflecting the reconfigured HDD, translates them, stores them in the table and stores the new meta data in the silicon storage volume.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more.

As used herein, a "set" of items may include one or more of such items.

As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims.

Use of ordinal terms such as "first", "second", "third", etc., "primary", "secondary", "tertiary", etc. in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

As used herein, "and/or" means that the listed items are alternatives, but the alternatives also include any combination of the listed items.

The invention claimed is:

1. A data storage system comprising:
   an application processor, a storage processor, and random access memory (RAM) coupled to a bus;
   a plurality of solid state drives (SSDs) comprising a silicon storage volume, the silicon storage volume coupled to the bus;
   a plurality of hard disk drive (HDD) devices comprising an HDD volume, HDD volume coupled to the bus;
   the application processor and the storage processor each having instructions which when executed cause the application processor and storage processor to perform actions including:
   the application processor receiving a write request;
   the application processor preparing internal write requests based on the write request;
   the storage processor processing the internal write request including
   checking a known location in the internal write request for a designation of a kind of data,
   when the kind of data is actual data, writing the actual data from the write request to the HDD volume,
   when the kind of data is meta data, translating a logical block address according to a table and writing the meta data to the SSD.

2. The data storage system of claim 1 wherein the known location is a command descriptor block.

3. The data storage system of claim 1 wherein the storage processor is a Redundant Array of Independent Disks (RAID) processor.

4. The data storage system of claim 1 wherein the silicon storage volume and the HDD volume conform to a Redundant Array of Independent Disks (RAID) configuration.

5. The data storage system of claim 1 wherein the storage processor has software which when executed causes the storage processor to translate a meta data logical block address (LBA) from an HDD volume LBA to an silicon storage volume LBA using a table.

6. The data storage system of claim 1 wherein the SSD volume comprises from one to four SSDs and wherein the HDD volume comprises from 32 to 127 HDDs.

7. A method of processing data write requests comprising:
   receiving a write request;
   an application processor preparing an internal write request based on the write request;
   a storage processor processing the internal write request including writing actual data to a hard disk drive (HDD) volume and meta data to a silicon storage volume according to a kind of data specified in a known location in the write request, wherein the silicon storage volume comprises at least one solid state drive (SSD) and the HDD volume comprises a plurality HDDs.

8. The method of claim 7 wherein the known location is a command descriptor block.

9. The method of claim 7 wherein the storage processor is a Redundant Array of Independent Disks (RAID) processor.

10. The method of claim 7 wherein the silicon storage volume and the HDD volume conform to a Redundant Array of Independent Disks (RAID) configuration.

11. The method of claim 7 further comprising:
    the storage processor translating a meta data logical block address (LBA) from an HDD volume LBA to a silicon storage volume LBA using a table.

12. The method of claim 7 wherein the silicon storage volume comprises from one to 64 SSDs and wherein the HDD volume comprises from 1280 to 5660 HDDs.

* * * * *